United States Patent [19]

Henderson

[11] 4,275,378

[45] Jun. 23, 1981

[54] MONITORING THE OPERATION OF A VEHICLE

[75] Inventor: Henning M. Henderson, Johannesburg, South Africa

[73] Assignee: Kiloking (Proprietary) Limited, South Africa

[21] Appl. No.: 934,557

[22] Filed: Aug. 17, 1978

[30] Foreign Application Priority Data

| May 23, 1978 | [ZA] | South Africa | 78/2964 |
| Jul. 26, 1978 | [ZA] | South Africa | 78/4243 |
| Jul. 26, 1978 | [ZA] | South Africa | 78/4245 |
| Jul. 26, 1978 | [ZA] | South Africa | 78/4246 |

[51] Int. Cl.³ .................. B60Q 5/00; G08B 21/00
[52] U.S. Cl. .................. 340/71; 340/52 R; 340/62; 340/669; 200/61.45 R; 346/18; 180/171
[58] Field of Search ............ 340/71, 52 R, 52 F, 340/53, 62, 66, 669, 72; 364/566, 569; 200/61.45 R, 61.52; 180/170, 171, 172; 346/17, 18

[56] References Cited

U.S. PATENT DOCUMENTS

| 3,035,133 | 5/1962 | Greenberg | 200/61.89 |
| 3,522,582 | 8/1970 | Tuttle | 340/71 |
| 3,635,101 | 1/1972 | Hsian | 340/62 |
| 3,787,808 | 1/1974 | Knopf | 340/71 |
| 3,863,205 | 1/1975 | Chun-Chih | 340/52 R |
| 3,899,664 | 8/1975 | Bencini et al. | 364/566 |
| 4,070,562 | 1/1978 | Kuno et al. | 364/566 |

FOREIGN PATENT DOCUMENTS

| 56954 | 1/1971 | Australia | 340/71 |
| 337017 | 6/1977 | Australia | 340/62 |

OTHER PUBLICATIONS

Transputer Limited "An Accessory for A Vehicle", Jan. 22, 1979, pp. 1-13.
Henderson, "Improvements in Vehicle Warning Devices", 1-22-79.
Henderson, "Improvements in Motor Vehicle Safety and/or Warning Devices", 1-22-79.

Primary Examiner—John W. Caldwell, Sr.
Assistant Examiner—Donnie L. Crosland
Attorney, Agent, or Firm—Karl W. Flocks

[57] ABSTRACT

A method of and apparatus for monitoring the operation of a motor vehicle subjected to a decelerative force, wherein the vehicle's throttle opening is sensed, an indication is given when the throttle opening exceeds a predetermined value, wherein the decelerative force is sensed, and wherein said predetermined value is varied automatically as said decelerative force on the vehicle varies. If the throttle opening continues to exceed said predetermined value, then a recording is made.

20 Claims, 23 Drawing Figures

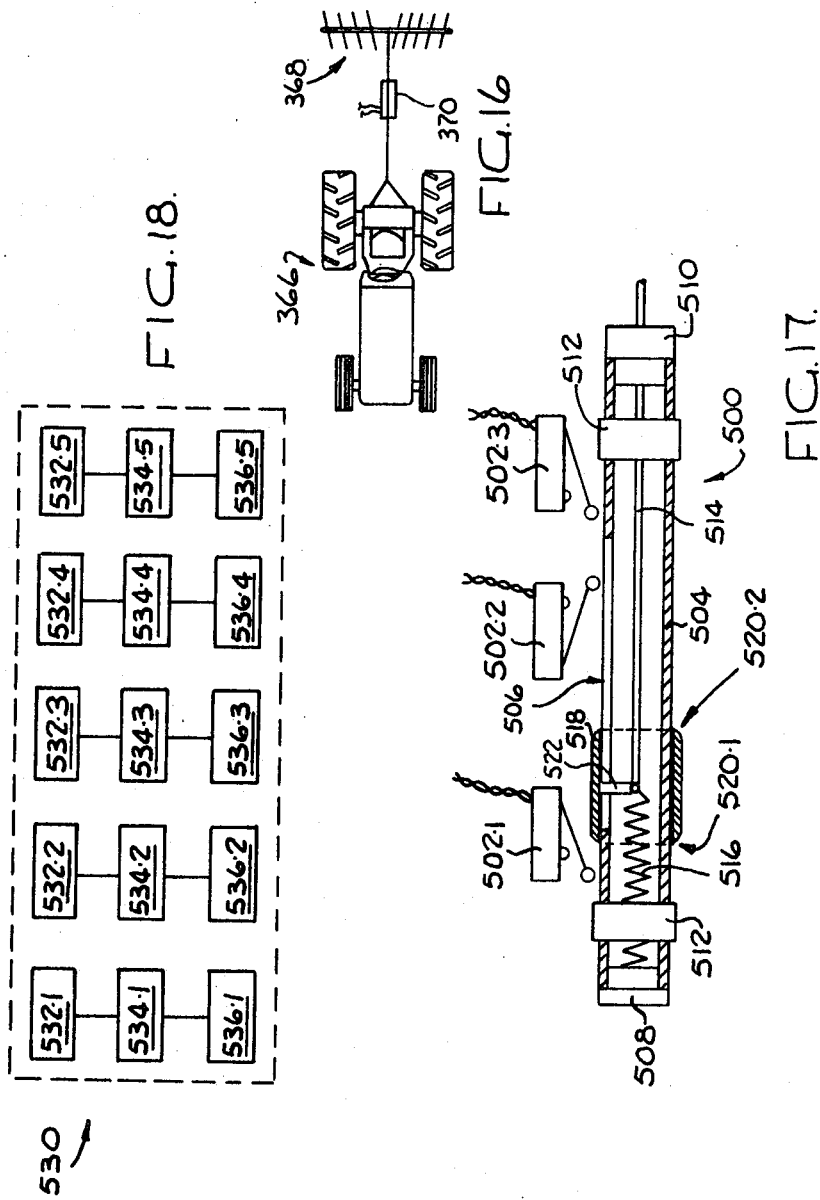

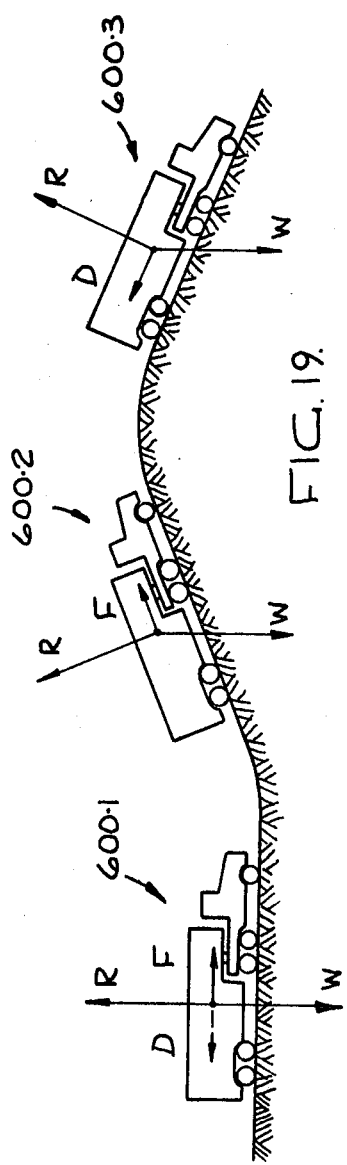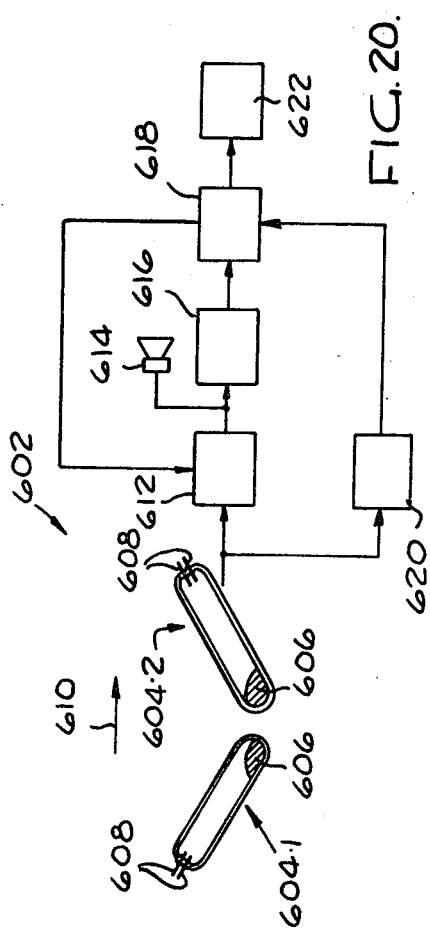

MONITORING THE OPERATION OF A VEHICLE

This invention relates to the monitoring of the operation of a motor vehicle.

The applicant has found that bad driving habits of drivers result in heavy financial losses by fleet owners of vehicles and others. Such losses can result from excessive fuel consumption and wear and tear generally but particularly on tires, brakes, clutches, and the like.

Applicant is aware of a system in which accelerative, decelerative and/or centrifugal forces on a vehicle in a plane parallel to the surface on which the vehicle is supported are sensed and in which a warning is issued and/or unit counts are recorded when these forces exceed a predetermined value. However, fuel wastage may occur even though the vehicle is not accelerating beyond the predetermined degree. This may, for example, happen when the engine is running at low speed and the accelerator pedal is depressed hard. Because of the inefficiency of the engine under these conditions, fuel is heavily wasted. Another disadvantage of this system is that it becomes more sensitive when the vehicle is inclined with respect to the horizontal, so that an unfair indication is given of a driver's driving performance when travelling over hilly terrain, going up or down ramps, and so on.

Applicant is also aware of a system whereby an electrical switch is closed when the accelerator pedal of a vehicle is depressed beyond a certain point, resulting in the energization of a blinking light or a buzzer and thereby warning the driver of the vehicle that he is indulging in an excess. In this system no recording is made of such excesses so that others cannot later assess the driver's performance. Another disadvantage of this system is that no allowance is made for the fact that more fuel is required when travelling uphill than when travelling downhill or along a level road.

It is an object of the present invention to overcome the above and other disadvantages which will become apparent later on in the present specification.

According to the invention described in Applicant's co-pending application U.S. application Ser. No. 934,561, filed Aug. 17, 1978, made jointly with another, there is provided a method of monitoring the operation of a motor vehicle, which method comprises:
sensing the vehicle's throttle opening;
sensing a parameter which corresponds to the magnitude of a variable load force acting on the vehicle in a direction opposite to the direction of forward travel of the vehicle; and
giving an indication when the throttle opening exceeds a predetermined throttle opening value, the predetermined throttle opening value being a varying function of said parameter.

As in the co-pending application, the term "throttle opening" in the present specification means the setting or position of the fuel supply mechanism of the vehicle, which is operative to admit fuel, air, or a fuel/air mixture to the engine in varying degrees, the setting or position corresponding to a particular degree of fuel, air, or fuel/air mixture supply to the engine.

The parameter may be the angle of inclination of the vehicle to the horizontal in the direction of forward travel of the vehicle, said load force being gravitational.

According to the present invention, said predetermined throttle opening value is a stepwise increasing function of said parameter, said function increasing stepwise in two or more steps as said parameter increases.

Alternatively, said predetermined throttle opening value may, over at least part of the range of said parameter, be a continuously increasing function of said parameter.

Where said load force is imposed by a load drawn by the vehicle via a draught connection, said parameter may be the load in the draught connection.

The giving of said indication may comprise issuing a warning signal to the driver of the vehicle.

Alternatively, or in addition, the giving of said indication may comprise making a recording.

The giving of said indication may comprise issuing a warning signal to the driver and then a predetermined time thereafter, if the throttle opening has not by then been reduced to below said predetermined value, making a recording.

The making of said recording may comprise recording unit counts at spaced intervals of time while the throttle opening exceeds said predetermined value.

The method may further comprise sensing accelerative, decelerative or centrifugal force on the vehicle in a plane parallel to the surface on which the vehicle is supported, and giving an indication when said force exceeds a predetermined value irrespective of the throttle opening.

Said accelerative, decelerative or centrifugal force may be sensed over a predetermined length of time, the method including making a recording if such accelerative, decelerative or centrifugal force has exceeded the predetermined value for less than the predetermined length of time, whilst inhibiting making of said recording if such force has exceeded the predetermined value for the whole of the predetermined length of time.

Said predetermined length of time may be between about 1 and 15 seconds.

Further according to the invention there is provided apparatus for monitoring the operation of a motor vehicle subjected to a load force acting on the vehicle in a direction opposite the direction of forward travel of the vehicle, which apparatus comprises:
first sensing means for sensing the vehicle's throttle opening, said first sensing means including first throttle sensitive means for sensing whether the throttle opening is above or below a first predetermined degree, and second throttle sensitive means for sensing whether the throttle opening is above or below a second, greater predetermined degree;
second sensing means for sensing a parameter which corresponds to the magnitude of said load force, said second sensing means including first parameter sensitive means for sensing whether said parameter is above or below a first predetermined value and second parameter sensitive means for sensing whether said parameter is above or below a second higher predetermined value; and
indicating means operative in response to said first sensing means and said second sensing means to give an indication either when the parameter is above said first predetermined value and the throttle opening is above said first predetermined degree, or when the parameter is above said second predetermined value and the throttle opening is above said second predetermined degree.

The second sensing means may be angle sensitive means adapted to sense the angle of inclination of the vehicle to the horizontal in the direction of travel of the vehicle, said load force being gravitational.

Further according to the invention, there is provided apparatus for monitoring the operation of a motor vehicle subjected to a load force acting on the vehicle in a direction opposite the direction of forward travel of the vehicle, which apparatus comprises:

first sensing means for sensing the vehicle's throttle opening;

second sensing means for sensing a parameter which corresponds to the magnitude of said load force; and indicating means operative in response to the first sensing means and the second sensing means to give an indication when the throttle opening exceeds a predetermined throttle opening value, which predetermined throttle opening value is, over at least part of the range of said parameter, a continuously increasing function of said parameter.

The apparatus may further comprise an inertial device for sensing accelerative, decelerative, or centrifugal force on the vehicle in a plane parallel to the surface on which the vehicle is supported, and indicating means operable in response to the inertial device to give an indication when such force exceeds a predetermined value irrespective of throttle opening.

The apparatus may further comprise a comparator means operative in response to the inertial device to determine whether said accelerative, decelerative or centrifugal force has exceeded the predetermined value for less than or for the whole of a predetermined length of time, the indicating means being operable in response to the comparator means to provide a recording when said force has exceeded the predetermined value for less than the predetermined length of time, whilst inhibiting recording when said force has exceeded said predetermined value for the whole of the predetermined length of time.

Said inertial device may comprise a container; a body of liquid contained in the container; a radiation emitter; and a radiation receptor for receiving radiation from the emitter; the body of liquid being displaceable in the container under inertial force and the emitter and receptor being arranged to detect the position of the body of liquid in the container thereby giving an indication of the existence of said accelerative, decelerative or centrifugal force.

The second sensing means may also comprise a container; a body of liquid contained in the container; a radiation emitter; and a radiation receptor for receiving radiation from the emitter; the body of liquid being displaceable in the container upon inclination of the container, and the emitter and the receptor being arranged to detect the position of the body of liquid in the container thereby giving an indication of the angle of inclination of the container.

The emitter may be a light emitter and the receptor a light detector, the emitter and detector being arranged on opposite sides of the container, the container permitting passage therethrough of light from the emitter to the detector, and the liquid being opaque to light.

The invention will now be described in more detail, by way of example, with reference to the accompanying drawings.

In the drawings:

FIG. 16 shows diagrammatically a plan view of a tractor having hitched thereto a soil working implement, and which includes a device in accordance with the present invention for sensing the load presented by the implement on the tractor;

FIG. 17 shows a cross-sectional view of a linear cam device in accordance with the present invention, which can be used in place of the rotary cam assembly shown in in FIGS. 5 to 9;

FIG. 18 shows a block diagram of a more sophisticated version of apparatus according to the present invention;

FIG. 19 illustrates the forces acting on a vehicle when it is travelling along a level road (left hand side of the drawing), when it is travelling up an incline (center of the drawing), and when it is travelling down an incline (right hand side of the drawing);

FIG. 20 shows a block diagram of part of apparatus in accordance with the present invention for monitoring the operation of the vehicle;

Figure 1:
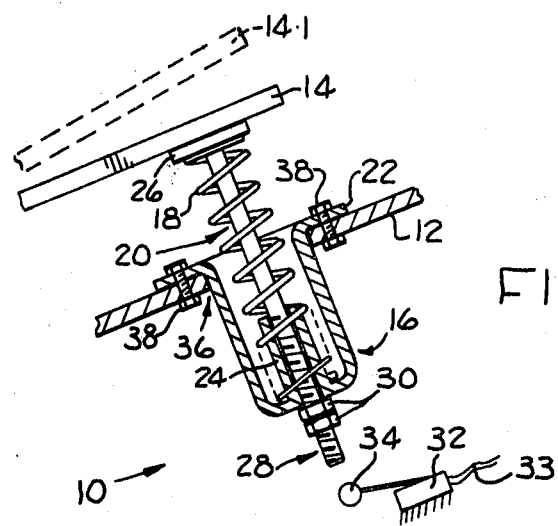
FIG. 1 is a cross-section through the floor-board of a motor vehicle, showing the arrangement of a switching device for sensing excessive throttle openings in accordance with the invention described in the co-pending application.

Referring now to FIG. 1, reference numeral 10 generally indicates a switching arrangement for sensing excessive throttle openings. In this Figure, the floor board of the vehicle is indicated by reference numeral 12 and its accelerator pedal by reference numeral 14.

The arrangement 10 comprises a cup-shaped body 16, a coil spring 18, and a plunger 20. At its rim, the body 16 has a radially outwardly extending flange 22, and at its bottom it has a sleeve-like guide 24 in which the plunger fits slidably, to extend through the bottom of the body 16. The plunger has a disc-shaped head 26 at one end and is screw-threaded at the other end as indicated by reference numeral 28. The spring 18 extends between the head 26 and the bottom of the body 16. On the screw-threaded end 28 of the plunger there are provided two nuts 30, one of which acts in use as a lock nut.

Below the body 16 there is mounted a micro switch 32 (herein also referred to as the accelerator switch) having electrical connections 33 and the actuator arm 34 of which is arranged such that the switch is actuated when the pedal 14 is depressed further than a predetermined distance.

In order to mount the device 10 in a motor vehicle, an opening 36 is cut in the floor board 12 below the accelerator pedal 14 and the body 16 secured in position to extend with its bottom through the opening thus cut out. The flange 22 will then seat against the inside surface of the floor board. The device is secured in position by means of bolts 38.

In order to adjust the position at which the spring 18 comes into operation, the nuts 30 may be adjusted along the screw-threaded end 28 of the plunger and locked into the desired position.

In operation, when the accelerator pedal 14 is depressed from its rest position as indicated by dotted lines at 14.1, it will travel against its normal bias until it abuts against the head 26. When the accelerator pedal is depressed further, additional force has to be applied in order also to depress the plunger 20 against the spring 18.

The switch 32 may be adjustably mounted so as to permit adjustment of the extent of pedal depression at which it will be actuated.

Figure 2:
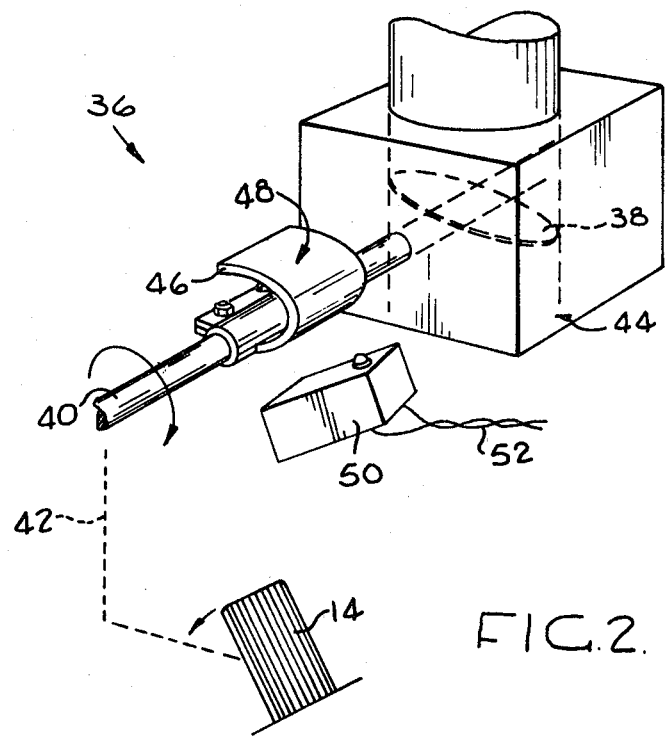
FIG. 2 is a diagrammatic perspective view of a motor vehicle's carburettor, showing a first alternative arrangement of a switching device for sensing excessive throttle openings in accordance with the invention described in the co-pending application.

Referring now to FIG. 2, reference numeral 36 generally indicates the throttle mechanism of a vehicle's engine. The throttle mechanism comprises an accelerator pedal 14, a butterfly valve 38, a butterfly valve spindle 40 on which the butterfly valve 38 is mounted, and a linkage 42 (shown schematically in dotted lines) interconnecting the spindle 40 and the accelerator pedal 14. The butterfly valve 38 forms part of throttling means 44 operable to admit air or an air-fuel mixture into the intake manifold of the engine of the vehicle in varying degrees.

On the spindle 40 there is mounted a cam 46 having a cam surface 48. Adjacent the cam 46 there is mounted in fixed relationship to the throttling means 44, a microswitch 50 (herein also referred to as the accelerator switch) which can be actuated by the cam 46. Electrical connections 52 lead from the switch 50 to the rest of the circuitry of the device.

In operation, if the accelerator pedal 14 is depressed beyond a certain point, the cam 46 will engage with the micro-switch 50, causing its contacts to close. The cam 46 is of a resilient material so that pedal depression beyond this point will be permitted. The point at which the switch 50 is engaged may be adjusted by adjusting the angular position of the cam 46 on the spindle 40.

Figure 3:
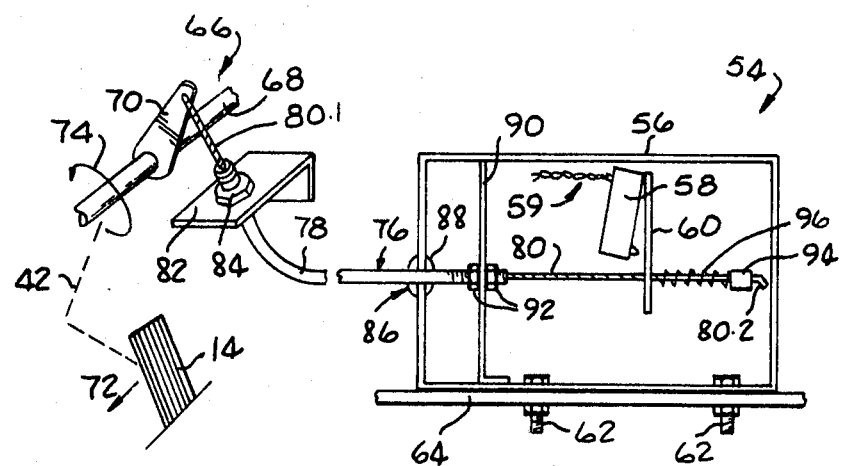
FIG. 3 is a diagrammatic perspective view of a motor vehicle's throttle linkage, showing a second alternative arrangement of a switching device for sensing excessive throttle openings in accordance with the invention described in the co-pending application.

Referring now to FIG. 3, reference numeral 54 generally indicates a switching arrangement having a housing or box 56 within which there is mounted a micro-switch 58 having electrical connections 59, and an operating arm 60. The box 56 is mounted by means of mounting screws 62 on a support bracket 64 located in a convenient position in the vehicle, eg below or behind the vehicle's dashboard.

The vehicle has a throttle mechanism 66 which includes a pivotally displaceable throttle spindle 68 fast with a butterfly valve (not shown) for controlling the flow of fuel/air mixture to the vehicle's engine, a radius arm 70 fast with the throttle spindle, an accelerator pedal 14, and a connecting linkage 42 (shown schematically in dotted lines) operatively connecting the accelerator pedal 14 to the throttle spindle 68. The arrangement is such that depression of the accelerator pedal 14 in the direction of arrow 72 causes pivotal displacement of the throttle spindle 68 in the direction of arrow 74, thereby permitting fuel/air mixture to be drawn into the vehicle's engine at an increased rate.

The throttle mechanism 66 is connected to the operating arm 60 of the microswitch 58 by means of a sheathed cable 76 having a sheath 78 and a cable 80 displaceable in to and fro fashion within the sheath. The sheath 78 is screw threaded at its two ends and is anchored at its end near the throttle mechanism 66 to a bracket 82. The bracket 82 is fast with the body of the vehicle and anchoring is effected by means of two nuts 84 (only one of which is visible) screwed on the screw-threaded end of the sheath. The sheathed cable 76 passes through an opening 86 in the wall of the box 56. The opening 86 is provided with a grommet 88. At its other end the sheath 78 is anchored to an internal wall 90 of the box 56 by means of two nuts 92. One end 80.1 of the cable 80 is attached to the free end of the radius arm 70, and the other end 80.2 passes slidably through an opening (not shown) in the operating arm 60 of the microswitch 58. On the end 80.2 of the cable there is crimped a stop 94. On the cable 80, between the stop 94 and the operating arm 60, there is arranged a coil spring 96.

In operation, if the accelerator pedal 14 is depressed in the direction 72, the cable 80 will slide along the sheath 78 from right to left. If the pedal is depressed beyond a predetermined point, the coil spring 96 will abut against the arm 60 and against the stop 94 and cause operation of the microswitch 58.

The throttle opening at which the switch 58 is switched may be adjusted by adjusting the mountings of the sheath 78 on the bracket 82 or on the internal wall 90, by adjusting the position of the switch 58 in the box 56, or by adjusting the position of the stop 94 on the cable 80. In order to render the system tamper-proof, the nuts 84 may be locked eg by spot-welding, so that the mounting on the bracket 82 cannot be adjusted. Also, the end 80.1 of the cable may be secured to the radius arm 70 by means of, for example, a lead seal (not shown). Adjustments can then only be made within the box 56 by adjusting either the nuts 92, the position of the switch 58, or the position of the stop 94 on the cable 80. The box 56 may have a key-operated lid by means of which it can be locked in the closed position, thereby preventing unauthorised access to the interior of the box.

Figure 4:
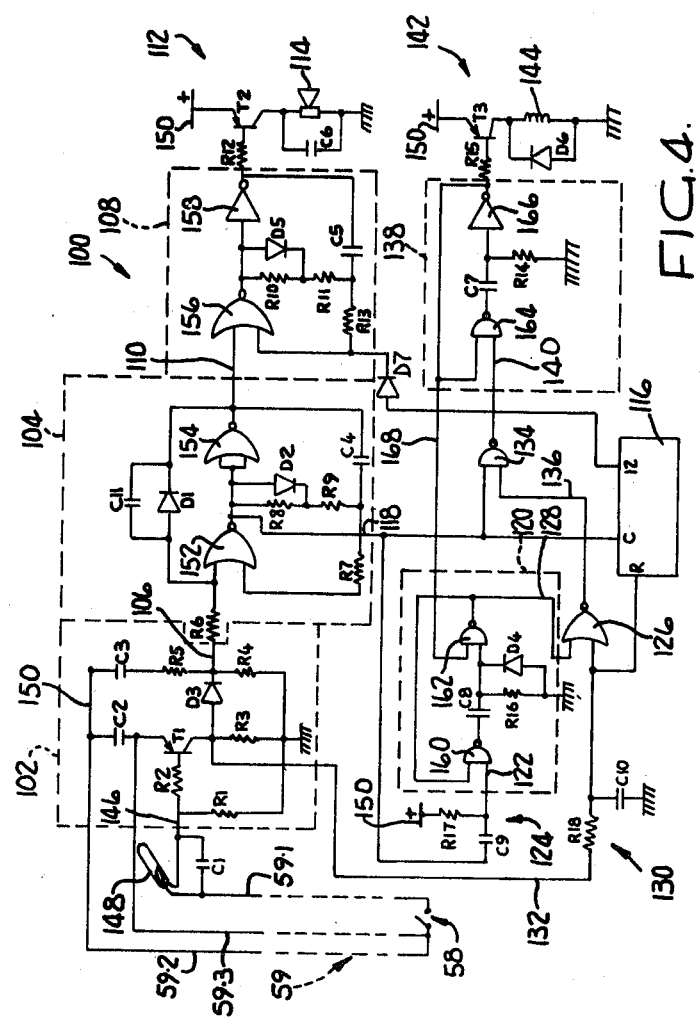
FIG. 4 is a circuit diagram of a monitoring device for monitoring excessive throttle openings and making use of any one of the switching devices shown in FIGS. 1 to 3 in accordance with the invention described in the co-pending application.

Referring now to FIG. 4, reference numeral 100 indicates the electrical circuit diagram of a monitoring device of which any one of the accelerator switches 32, 50 and 58 of FIGS. 1 to 3 forms part. In FIG. 4 the accelerator switch is indicated by reference numeral 58. The monitoring device comprises: a switching circuit 102; an a-stable circuit 104 connected to the switching circuit 102 via a connection 106; a tone generator 108 connected to the a-stable circuit 104 via a connection 110; an output stage 112 connected to the output of the tone generator 108 via a resistor R12 and comprising a switching transistor T2, a loudspeaker 114, and a capacitor C6 connected across the loudspeaker; a first timing circuit 116, the input of which is connected to the a-stable circuit 104 via a connection 118, and the output of which is connected via a gating diode D7 to the tone generator 108; a second timing circuit 120 which has its input 122 connected to the a-stable circuit 104 via an RC differentiator circuit 124 and the connection 118; a NOR-gate 126 having its one input connected to the output 128 of the second timing circuit 120 and its other input connected to the switching circuit 102 via an RC integrator circuit 130 and a connection 132; a NAND gate 134 having one of its inputs connected to the output of the NOR gate 126 via a connection 136 and its other input connected to the a-stable circuit 104 via the connection 118; a counter pulse generating circuit 138 which has its trigger input connected to the output of the NAND gate 134 via a connection 140; and an output stage 142 connected to the output of the pulse generating circuit 138 via a resistor R15, and comprising a switching transistor T3, a coil 144 of a counter relay, and a free-wheeling diode D6 connected across the coil 144.

As will further be seen in FIG. 4, one pole of the accelerator switch 58 is connected to an input 146 of the switching circuit 102 via a conductor 59.1 of the connection 59, and an angle sensitive mercury switch 148. The mercury switch 148 is mounted on the vehicle's chassis such that its contacts are normally closed, but open when the vehicle is inclined at more than a predetermined angle to the horizontal. A capacitor C1 is connected across the terminals of the mercury switch 148 to eliminate the effect of splashing of the mercury in the switch under rough road conditions. The other pole of the accelerator switch 58 is connected to a positive supply rail 150 in the device 100 via a conductor 59.2 of the connection 59. A further conductor 59.3 is connected from said other pole of the accelerator switch 58 to the emitter of a transistor T1 in the switching circuit 102, a capacitor C2 being connected between the emitter and the positive rail 150.

The switching circuit 102 further comprises a capacitor C3, resistors R1, R2, R3, R4 and R5, and a diode D3 which, as is shown in the drawings, are connected in such a manner that, when the accelerator switch 58 is open (ie under normal conditions) then the transistor T1 is switched on and the voltage on the output 106 high. When the switch 58 is closed (ie when the driver indulges in an excess by depressing the accelerator pedal 14 beyond a predetermined position) the transistor T1 switches off and the voltage on the output 106 drops to a low value after a short time delay which depends on the values of C3, R5 and R4.

The astable circuit 104 comprises a pair of NOR gates 152 and 154, capacitors C4 and C11, resistors R6, R7, R8 and R9, and diodes D1 and D2, which, as shown in the drawings, are connected to form an astable multivibrator circuit having an 'off' time of about 0.5 seconds and an 'on' time of about 1.5 seconds. Its frequency is thus about 2 seconds. Operation of the astable circuit 104 is initiated as soon as the voltage on the connection 106 drops to a low value, and is inhibited when the voltage on the connection 106 is at a high value.

The tone generator 108 comprises a NOR gate 156 and an inverter 158, a capacitor C5, resistors R10, R11, and R13, and a diode D5, connected as shown in the drawings to form an astable multivibrator having a frequency of about 400 Hz and a mark to space ratio of 7 to 1. The connection 110 is connected to one of the inputs of the NOR gate 156 and the diode D7 is connected to the other input thereof. When either one of the inputs of the NOR gate 156 is kept high, oscillation of the tone generator will be inhibited.

The first timing circuit 116 is in the form of a 12 bit counter having its input or counter terminal C connected via the connection 118 to the output of the NOR gate 152 in the astable circuit 104 and having its last output stage '12' connected via the gating diode D7 to one of the inputs of the NOR gate 156 in the tone generator 108. Its reset terminal R is connected via the RC integrator 130 and the connection 132 to the collector of the transistor T1 in the switching circuit 102.

The second timing circuit 120 comprises a pair of NAND gates 160 and 162, a capacitor C8, a resistor R16, and a diode D4, which are connected as shown in the drawings to form a monostable multivibrator being stable in the 'on' state and having an 'off' time of about 2 seconds or longer.

The RC differentiator 124 comprises a capacitor C9, and a resistor R17 tied to the positive rail 150.

The RC integrator 130 comprises a resistor R18, and a capacitor C10 tied to ground.

The counting pulse generator 138 comprises a NAND gate 164, an inverter 166, a capacitor C7, and a resistor R14, connected as shown in the drawings to form a monostable multivibrator being stable in the 'on' state and having an 'off' time of about 50 milliseconds.

During normal driving conditions, the accelerator switch 58 will be open so that the transistor T1 is switched on and oscillation of the astable circuit 104 is inhibited. Thus, the output voltage on the connection 110 will be high so that oscillation of the tone generator 108 will also be inhibited. The output voltage of the NOR gate 152 will be low and the first timing circuit 116 in its reset condition.

When the driver indulges in an excess by depressing the accelerator pedal 14 down beyond a predetermined position the accelerator switch 58 will close and, provided the angle sensitive switch 148 is also closed, the transistor T1 will switch off, thereby enabling the astable circuit 104. Thus the output of the NOR gate 152 will go high for 0.5 seconds and the output of NOR gate 154 will go low for 0.5 seconds. This will be repeated every 2 seconds for as long as the accelerator pedal is kept down.

For each 0.5 second 'off' pulse on the output of NOR gate 154, the tone generator 108 will be enabled, thus giving a 0.5 second acoustic bleep which will warn the driver that he is depressing his accelerator pedal too far.

At the end of each bleep, ie when the output of NOR gate 152 switches from high to low, a low going pulse will be provided by the differentiator circuit 124 to the second timing circuit 120, causing the output voltage on connection 128 to go from high to low. With the accelerator pedal in the depressed condition, the voltage at the output of the integrator circuit 130 will also be low so that the output of NOR gate 126 will go high as soon as the voltage on the connection 128 goes low. This enables the NAND gate 134 via the connection 136, which means that, as soon as the output of the NOR gate 152 switches high again at the start of the next warning bleep, the output 140 of the NAND gate 134 will go high, triggering the count pulse generator 138. This will cause a count pulse to be fed to the count relay coil 144, which will cause the relay to record a count. At the same time the second timing circuit 120 will be reset via a connection 168 which leads from the output of the inverter 166 to one of the inputs of the NAND gate 162.

This process will continue for as long as the accelerator pedal 14 is kept down, so that a count is recorded at the start of each warning bleep except the first one.

For each bleep a pulse will be fed to the counter input C of the first timing circuit 116. After 512 counts (about 15 minutes) the last stage of the counter will go high. This will inhibit the tone generator 108 via the gating diode D7 so that the bleeping stops. The counter will nevertheless continue recording a count every 2 seconds. The purpose of the first timing circuit is to stop the bleeping in case of a faulty circuit or switch 58. The driver of the vehicle will in such a case, however, have to account for a faulty circuit or switch because his counter will show a very high count.

If the pedal 14 is released within two seconds from the occurrence of a bleep, the voltage on the connection 136 will go low again before the voltage on the connection 118 goes high for the second time so that no count will be recorded for that particular bleep.

Also, if the pedal 14 is released, a reset pulse will, after a short time delay which will depend on the values of R18 and C10, be fed to the reset terminal R of the first counter 116. Accordingly, if the pedal is released at any time during the fifteen minute period referred to above, or thereafter, and there is no fault in the circuit or the switch 58, the circuit 116 will be reset so that bleeping will again occur for a full fifteen minutes if the pedal is again kept depressed for a long period of time.

The angle sensitive switch 148 will open to prevent operation of the monitoring device when the vehicle in which the device is mounted is climbing a hill which is steeper than a predetermined degree. This is particularly useful in the case of transport vehicles where it is necessary to apply full throttle in order to climb steep inclines.

The connection 59 is arranged so that its end connections are not visible and the conductors 59.1, 59.2 and 59.3 will all have identically coloured insulation. If the device is tampered with by short circuiting the conductor 59.1 to any one of the conductors 59.2 or 59.3, or by cutting any one of the conductors 59.2 or 59.3, the device will start bleeping. Sabotaging of the device will only be successful if the conductor 59.1, and only that conductor, is cut. This will make successful sabotaging of the device very difficult.

Figure 5:
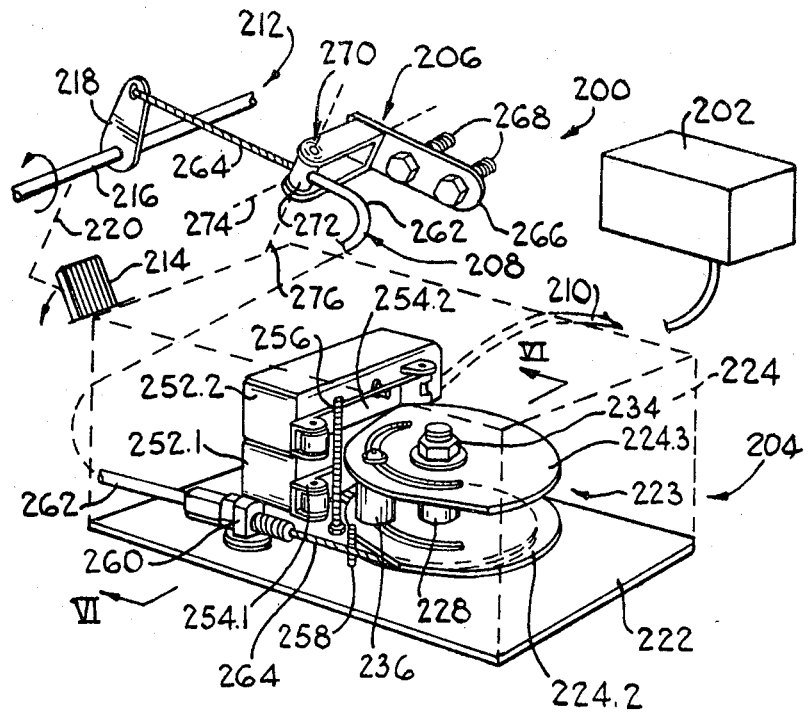
FIG. 5 is a diagrammatic perspective view showing a monitoring device in accordance with the present invention for monitoring excessive throttle openings of a motor vehicle, and its connection to the throttle linkage of the vehicle.
Figure 6:
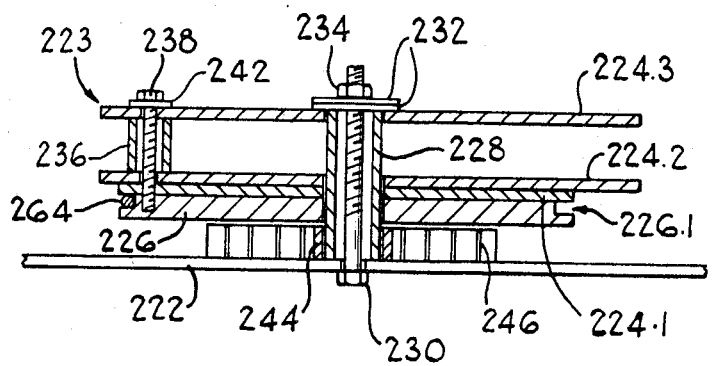
FIG. 6 shows a cross-sectional view of a cam assembly forming part of the device of FIG. 5, taken on line VI—VI in FIG. 5.
Figure 7:
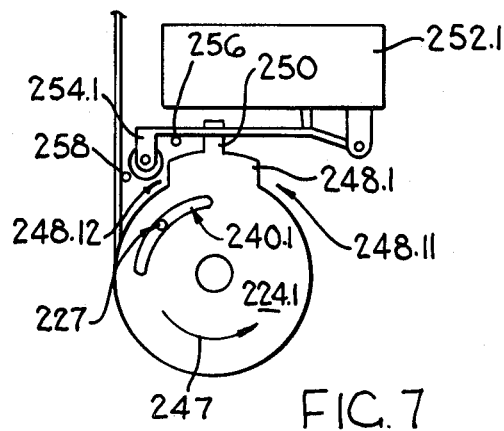
FIG. 7 shows a plan view of a first cam forming part of the cam assembly of FIGS. 5 and 6.
Figure 8:
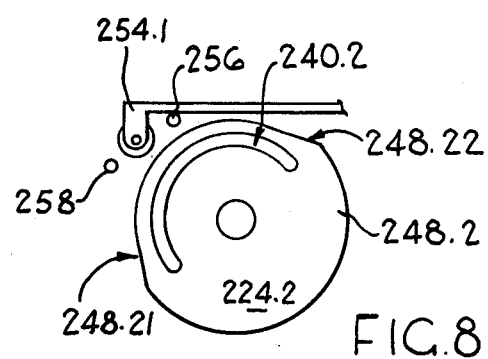
FIG. 8 shows a plan view of a second cam forming part of the cam assembly of FIGS. 5 and 6.
Figure 9:
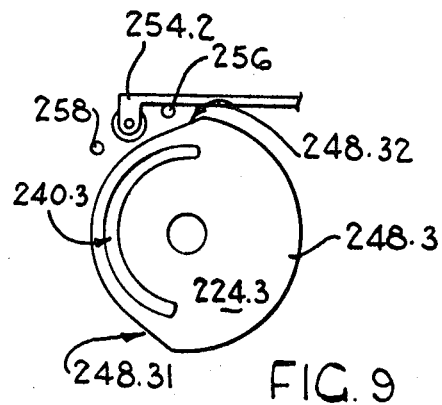
FIG. 9 shows a plan view of a third cam forming part of the cam assembly of FIGS. 5 and 6.
Figure 11:
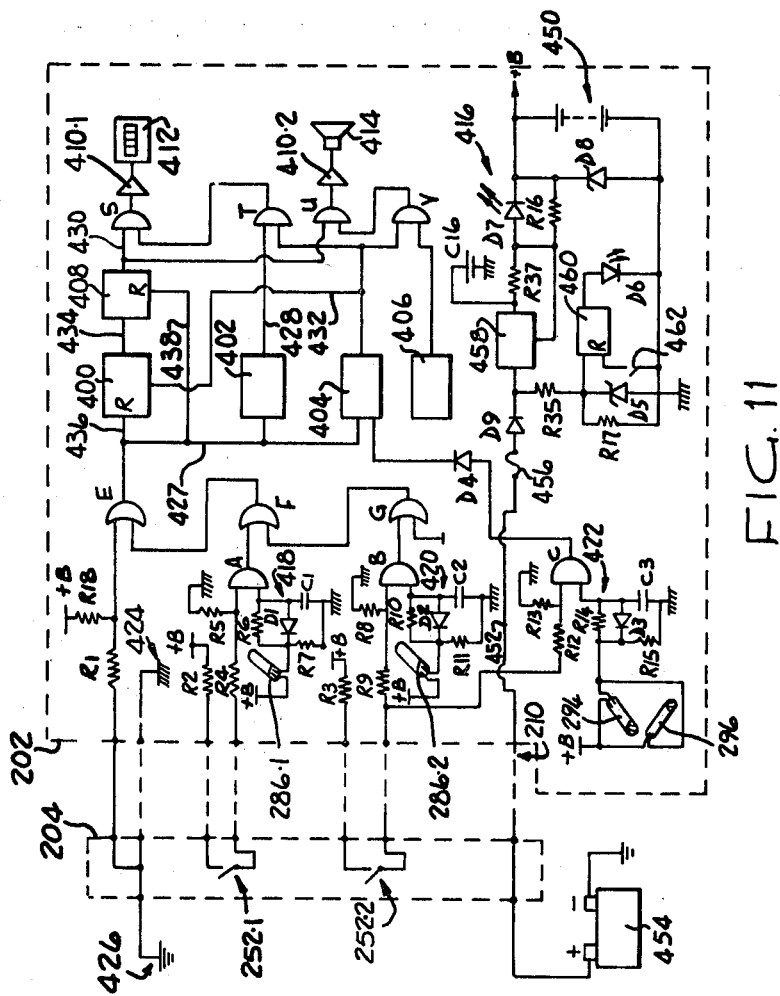
FIG. 11 shows an electrical circuit/block diagram of the device of the present invention.

Referring now to FIG. 5, reference numeral 200 generally indicates a monitoring device which comprises a monitoring box 202 containing the electronic and other parts of the device, a switch box 204, a cable end bracket 206, a 'Bowden' or a sheathed cable 208 extending between the switch box 204 and the bracket 206, and a seven core electrical cable 210 interconnecting the switch box 204 and the monitoring box 202 (see also FIG. 11).

Reference numeral 212 generally indicates part of the throttle mechanism of a motor vehicle in which the monitoring device 200 is installed. The throttle mechanism includes an accelerator pedal 214, a pivotally displaceable throttle spindle 216 fast with a butterfly valve (not shown) for controlling the flow of fuel/air mixture to the vehicle's engine, a radius arm 218 fast with the throttle spindle, and a connecting linkage 220 (shown schematically by a dotted line) interconnecting the throttle spindle 216 and the accelerator pedal 214.

Reference will now also be made to FIGS. 6 to 9. The switch box 204, which is mounted on the body of the vehicle, has a base plate 222 and a hollow cover 224 (drawn in phantom lines to show the inner parts). The switch box further has locking means (not shown) whereby the cover 224 can be locked onto the base plate 222, so that the box 204 cannot be opened by unauthorised persons.

Within the box 204 there is mounted a cam assembly 223 comprising a series of three ganged cams indicated by reference numerals 224.1, 224.2 and 224.3 respectively, and a round disc 226. The disc 226 has a recess 226.1 in its periphery so that it forms a sheave together with the cam 224.1. The cams 224.1 through to 224.3 and the disc 226 are all rotatable about a central bush 228. The bush 228 is secured in place on the base plate 222 by means of a central bolt 230 which passes through the base plate 222, through the centre of the bush 228, and through two washers 232 at the other end of the bush. The bolt 230 is tightened down by a nut 234.

The two cams 224.2 and 224.3 are held apart by a cam spacing bush 236 arranged between them near the periphery thereof. The cams 224.1 through to 224.3 and also the disc 226 are held together as a ganged unit by means of a bolt 238. The bolt 238 passes through an arcuate slot 240.1 in the cam 224.1, an arcuate slot 240.2 in the cam 224.2, through the centre of the cam spacing bush 236, and through an arcuate slot 240.3 in the cam 224.3. The head of the bolt 238 engages with the outside of the cam 224.3 via a washer 242, and the screw threaded end thereof engages with a screw threaded hole 227 (FIG. 7) in the disc 226.

When the screw 238 is loosened slightly, the cams 224.2 and 224.3 can be adjusted relative to one another and to the cam 224.1, about their common rotational axis. When the screw 238 is tightened, the cams are locked in position relative to one another.

The cam assembly 223 is spaced from the base plate 222 by means of a central spacer bush 244. In the space thus formed between the base plate 222 and the disc 226 there is arranged a clockwork type spiral spring 246 which has its ends connected to the base plate 222 and to the disc 226 respectively, to bias the cam assembly 223 in an anti-clockwise direction as indicated by arrow 247 in FIG. 7.

The cam 224.1 has a lobe 248.1 with a leading edge 248.11 and a trailing edge 248.12. It also has a tongue 250 which protrudes radially from the lobe 248.1. The cam 224.2 has a lobe 248.2 with a leading edge 248.21 and a trailing edge 248.22. Likewise, the cam 224.3 has a lobe 248.3 with a leading edge 248.31 and a trailing edge 248.32.

On the base plate 222, adjacent the cam assembly 223, there are mounted two microswitches 252.1 and 252.2, the one on top of the other. The switch 252.1 has an actuating arm 254.1 and the switch 252.2 an actuating arm 254.2. The switch 252.1 is positioned to be actuated by the cams 224.1 and 224.2, and the switch 252.2 is positioned to be actuated by the cam 224.3.

On the base plate 222 there are further mounted two stops namely stop 256 and stop 258. The stop 256 has two purposes, one of which is to provide a stop against which the arms 254.1 and 254.2 of the microswitches 252.1 and 252.2 can rest when the switches are in their unactuated conditions, and the other of which is to provide a first limit stop for the cam assembly 223 by abutment thereagainst of the tongue 250 when the cam assembly is in its fully anti-clockwise position. The purpose of the stop 258 is to form a second limit stop for the cam assembly 223 by abutment thereagainst of the tongue 250 when the cam assembly is in its fully clockwise position.

Still further on the base plate 222 there is mounted a cable end bracket 260.

The sheathed cable 208 has a sheath 262 and a cable 264 extending through the sheath. One end of the cable 264 extends partly around the sheave formed by the disc 226 and the cam 224.1, the cable being located in the recess 226.1, and is fastened to the disc 226. (The point of fastening is not visible in the drawings). Thus, by applying tension to the cable 264, the cam assembly 223 will be displaced in a clockwise direction against the bias of the spring 246.

The other end of the cable 264 is connected to the radius arm 218. Thus, by depressing the accelerator pedal 214, tension will be applied to the cable 264, causing clockwise displacement of the cam assembly 223.

The cable end bracket 206 comprises a plate 266 which can be bolted to the vehicle body by means of two bolts 268. The bracket 206 further comprises a yoke 270 and a sheath support 272. The yoke 270 is mounted on the plate 266 to be pivotal about an axis 274, and the sheath support 272 is mounted in the yoke 270 so as to be pivotal about an axis 276 extending at right angles to the axis 274. One end of the sheath 262 abuts against the sheath support 272, and the other end thereof engages with the cable end support 260. The engagement with the cable end support 260 is adjustable, whereas the engagement with the sheath support 272 is not.

When the switch box 204 and the sheathed cable 208 have been installed, the bolt 238 is loosened slightly and, with the accelerator pedal 214 in the undepressed position, the cam 224.1 adjusted so that the trailing edge 248.12 thereof is on the point of actuating the switch 252.1. Thereafter the accelerator pedal 214 is depressed to a position which will be required if the vehicle is to travel up a slight incline of, say, 1 in 30 at a predetermined steady speed. The cam 224.2 is then adjusted until the leading edge 248.21 thereof is on the point of actuating the switch 252.1. Thereafter, the accelerator pedal 214 is depressed still further to a position which will be required if the vehicle is to travel at a steeper incline of, say, 1 in 20 at said predetermined steady speed. The cam 224.3 is then adjusted until the leading edge 248.31 thereof is on the point of actuating the switch 252.2. Thereupon the bolt 238 is tightened.

If the cable 264 is cut, or if an attempt is made effectively to lengthen the cable 264 by shortening the sheath 262, the switch 252.1 will be actuated by the trailing edge 248.12 of the cam 224.1. Counter-clockwise rotation of the cam 224.1 when the cable 264 has been cut will be limited by the tongue 250 engaging with the stop 256.

Figure 10:
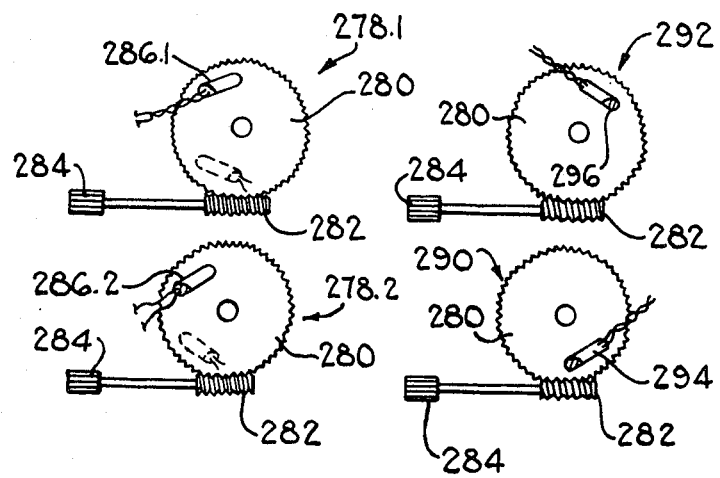
FIG. 10 shows two pairs of angle sensitive switches forming part of the monitoring device of the present invention.

Referring now to FIG. 10, there are shown two angle sensitive devices 278.1 and 278.2, an acceleration sensitive device 290 and a deceleration sensitive device 292, all of which are mounted inside the monitoring box 202. Each of the devices 278.1, 278.2, 290 and 292 comprises a toothed disc 280 engaging with a worm wheel 282, and an adjustment knob 284 fast with the respective worm wheel 282. Thus, the angular positions of the four toothed discs 280 can be adjusted independently by adjusting their respective adjustment knobs 284. All four the toothed discs 280 are rotatable about an axis which in use will extend horizontally and transversely with respect to the vehicle in which the device 200 is installed. On the toothed disc 280 of the angle sensitive device 278.1 there is mounted a mercury switch 286.1, and on the toothed disc 280 of the angle sensitive device 278.2 there is mounted a mercury switch 286.2. Similarly, on the disc 280 of the acceleration sensitive device 290 there is mounted a mercury switch 294, and on that of the deceleration sensitive device there is mounted a mercury switch 296.

The angle sensitive devices 278.1 and 278.2 are adjusted in such a manner that, when the monitoring box 202, which is secured to the body of the vehicle, is in a horizontal position, then both the mercury switches 286.1 and 286.2 will be in the closed position, as shown in FIG. 10. When the monitoring box 202 is, as a result of an incline against which the vehicle is to travel, tilted at an angle of more than, say, 1 in 30, then the mercury switch 286.1 will open, whereas, when the monitoring box is tilted at an angle of more than, say, 1 in 20, then the mercury switch 286.2 will also open. The angles at which the switches 286.1 and 286.2 will open can be adjusted by adjusting the respective knobs 284.

To change the direction of tilt at which the mercury switches 286.1 and 286.2 will open, the angular position of the discs 280 may be adjusted such that the mercury switches 286.1 and 286.2 will be in the positions as shown in dotted lines in FIG. 10. Thus, the monitoring box 202 in which the angle sensitive devices 278.1 and 278.2 are fixtures may, for example, be mounted either on the dashboard of the vehicle with the knobs 284 protruding rearwardly, or on the rear cabin wall of the vehicle with the knobs 284 protruding forwardly.

The acceleration sensitive mercury switch 294 is adjusted such that its contacts are made upon excessive acceleration of the vehicle, such as when the clutch of the vehicle is let out too rapidly, as a result of inertial forces on the mercury contained in it. The mercury switch 294 is inclined at an angle greater than that of the mercury switch 286.2, which in turn is inclined at an angle greater than that of the mercury switch 286.1.

The deceleration sensitive mercury switch 296 is adjusted such that is contacts are made upon excessive braking of the vehicle, as a result of inertial forces on the mercury contained in it.

Reference will now be made to FIG. 11 of the drawings in which there is shown an electrical citcuit/block diagram of the monitoring device 200.

Within the monitoring box 202 there are, amongst others, provided an 8-bit binary counter 400; a 1.8 seconds time delay circuit 402; a pulse generator 404 for generating pulses having a pulse width of about 100 milliseconds and a frequency which is switchable between either one of two frequencies, namely about 1 Hz and about 2 Hz; a 400 Hz oscillator 406; an electronic lock-out device 408; two amplifiers 410.1 and 410.2; an electro-mechanical counter 412; a loudspeaker 414; and a power supply 416 which provides a DC voltage on a positive rail marked +B.

The microswitch 252.1 is connected between the positive rail +B and one of the inputs of an AND gate A via current limiting resistors R2 and R4. Likewise, the microswitch 252.2 is connected between the positive rail +B and one of the inputs of an AND gate B via current limiting resistors R3 and R9.

The angle sensitive switch 286.1 is connected between the positive rail +B and the other input of AND gate A via a time delay circuit 418 comprising resistors R6 and R7, capacitor C1, and diode D1. Likewise, the angle sensitive switch 286.2 is connected to the other input of the AND gate B via a time delay circuit 420 comprising resistors R10 and R11, capacitor C2, and diode D2.

The junction between the microswitch 252.2 and the resistor R9 is connected via a resistor R12 to one of the inputs of an AND gate C. The other input of the AND gate C is connected to the positive rail +B via the parallel connected mercury switches 294 and 296 and a series connected time delay circuit 422 comprising resistors R14 and R15, capacitor C3 and diode D3.

The components of the time delay circuit 418 are selected so that, when the angle sensitive switch 286.1 opens, then the capacitor C1 will discharge in about 1 to 2 seconds, whereas, when the angle sensitive switch 286.1 closes again, it will charge up in about 0.03 seconds.

The components of the time delay circuit 420 are selected to give the same charging and discharging times as the time delay circuit 418.

The components of the time delay circuit 422 are selected so that, when one of the mercury switches 294, 296 closes, the capacitor C3 will charge up in about 0.13 seconds, whereas, when it opens again, the capacitor C3 will discharge in about 1 to 2 seconds.

The electronic circuitry in the monitoring box 202 has an earth 424 which is connected to the vehicle earth or chassis 426 via the switch box 204 by means of one of the conductors of the cable 210. The earth connection of the switch box 204 is connected via a further one of the conductors of the cable 210 and a resistor R1 to one of the inputs of an OR gate E. The junction between resistor R1 and the OR gate E is connected to the positive rail +B via a resistor R18.

The operation of the device is as follows. When the vehicle in which the device is mounted is travelling along a level road, both the angle sensitive mercury switches 286.1 and 286.2 will be closed. If the accelerator pedal 214 of the vehicle is now depressed beyond a first predetermined position, the leading edge 248.21 of the cam 224.2 will cause the actuating arm 254.1 of the microswitch 252.1 to be actuated. This will cause an output signal to appear on the output of the AND gate A, which will trigger the timer 402 via OR gates F and E and a connection 427. Output 428 of the timer 402 will normally be high, but as soon as the timer is triggered, the output will drop to a low value for a time period of approximately 1.8 seconds, whereafter it will again rise to a high value. Furthermore, as soon as an output signal appears on the output of the AND gate A, the pulse generator 404 will commence operation, also via the connection 427, generating pulses at a frequency of 1 Hz. While the output of the timer 402 is in the low condition, the electromechanical counter 412 will be inhibited by means of AND gate T so that it cannot record any counts. Output 430 of the lockout device 408 is normally high so that, at the end of the 1.8 second delay of the timer 402, the electromechanical counter 412 will commence counting each output pulse of the pulse generator 404 via gates T and S and the amplifier 410.1. This will accordingly happen with the third and subsequent pulses generated by the pulse generator 404 after the timer 402 has been triggered.

For every pulse of the pulse generator 404, the output of the oscillator 406 will be fed via the AND gates V and U to the amplifier 410.2 and cause a bleep to be generated by the loudspeaker 414.

Accordingly, if the driver of the vehicle keeps the accelerator pedal depressed beyond the first predetermined position for longer than two bleeps, a count will be recorded on the counter 412, commencing with the third bleep, once every second for as long as the pedal is held beyond that position. However, if he eases off on the accelerator pedal before the start of the third bleep, then no counts will be recorded on the counter.

When the driver eases off on the accelerator pedal so that the switch 252.1 opens again, the time delay circuit 402 is reset again. If desired, a delay may be built in the circuit 402 so that it is only reset after about 5 to 10 seconds (this may be adjustable) after the switch 252.1 has opened. Thus, if the driver again depresses the accelerator too far before the circuit 402 has reset, then counts will immediately begin to be recorded on the counter.

The output of the pulse generator 404 also advances the counter 400 via a connection 432. After two hundred and fifty six pulses have been counted (i.e. after a period slightly longer than four minutes) output 434 of the counter, which is normally at a high level, will switch to a low level, and thereby inhibit operation of the counter 412 and the loudspeaker 414 via gates S and U respectively. The purpose of the counter 400 is to stop bleeping and counting in case of a faulty circuit or a faulty switch 252.1 or 252.2. Immediately the output of OR gate E however drops to a low level again, the counter 400 and the lockout device 408 will be reset via connections 436 and 438 respectively.

If the vehicle travels against an incline of, say, more than about one in thirty, then the angle sensitive switch 286.1 will be open so that closing of the microswitch 252.1 will not cause an output signal to appear on the output of the AND gate A. However, if the accelerator pedal 214 is depressed beyond a second predetermined position, then the leading edge 248.31 of the cam 224.3 will actuate the actuating arm 254.2 of the microswitch 252.2. This will cause an output signal to appear on the output of the AND gate B which will, via OR gate G, have the same consequences as the appearance of an output signal on the output of the AND gate A, as described above.

If the vehicle has to travel against an incline of more than say, one in twenty, then the angle sensitive switch 286.2 will also be open, so that actuation of the switch 252.2 will not cause an output signal to appear on the output of the AND gate B. Under these conditions, the driver of the vehicle may depress his accelerator pedal as far as he wishes, without any counts or bleeps occurring.

Once the incline against which the vehicle is travelling decreases again, the angle sensitive switch 286.2 or 286.1, as the case may be, will close, bringing the microswitch 252.2 or 252.1, as the case may be, back into operation.

If desired, a time delay of about 2 seconds (not shown in the drawings) may be built into the circuit of microswitch 252.1 or into that of both microswitches 252.1 and 252.2 in order to prevent bleeping for a short time after the relevant switch or switches have closed. This will allow temporary hard accelerator depressions such as may be necessary during double declutching in big manual gearbox trucks. A switch (also now shown in the drawings) may be provided so that this time delay may be switched into circuit when the monitoring device is to be used for trucks, and out of circuit when it is to be used for smaller vehicles.

If the driver abuses the vehicle's clutch by letting it out too rapidly or accelerates heavily, the mercury switch 294 comes into operation. It will be seen from the drawing that, if the microswitch 252.1 is closed, i.e. when the accelerator pedal 214 is depressed beyond the second predetermined degree, and if the mercury switch 294 is also closed, i.e. if the driver abuses the clutch or accelerates heavily, then an output signal will appear on the output of the AND gate C. This causes the oscillator 404 via diode D4 to commence oscillation at a frequency of 2 Hz. Thus, bleeps will be generated and counts recorded at twice the normal frequency for excessive accelerator pedal depression. Also, there will be no delay before counting commences.

The operation of the deceleration sensitive mercury switch 296 is the same under excessive deceleration as that of the mercury switch 294 under excessive acceleration, but in this case the circuit will have to be modified slightly by connecting the first input of AND gate C to the positive rail +B.

The power supply 416 is connected via a connection 452 and one of the connections of the cable 210 to the positive terminal of the vehicle's battery 454 and comprises a chargeable nickel-cadmium battery 450. The battery 450 is connected to the connection 452 via a fuse 456, a diode D9 a voltage stabilising device 458, a resistor R37 and a light emitting diode D7. A zener diode D8 is connected across the battery 450. The light emitting diode D7 is arranged to provide a continuous green indication when the device is in operation. The power supply 416 is designed so as to be compatible with a vehicle battery 454 of anything between 12 and 36 volts. The nickel-cadmium battery is not absolutely necessary and may be eliminated.

Between the diode D9 and the voltage stablising device 458 there are connected in series to earth two resistors R35 and R17. Across the resistor R17 there is connected a zener diode D5 and a bistable circuit 460. The output of the bistable circuit 460 is connected to a light emitting diode D6. The bistable device 460 is arranged to switch on the light emitting diode D6 to provide a red indication as soon as the connection to the vehicle's battery 454 is broken and made again. This will, for instance, happen if the cable 210 is cut and an attempt made to join it again. The light emitting diode D6 will remain on until the bistable circuit 460 is reset again by depressing a reset button 462. The reset button 462 is arranged within the locked enclosure of the monitoring box 202 so that the bistable circuit can only be reset by an authorised person. If the light emitting diode D6 is on, then the supervisor will known that the device has been tampered with.

If an attempt is made to cut only some of the conductors of the cable 210, chances are that the conductor between the vehicle earth 426 and the resistor R1 is cut. This will cause an output signal to appear on the output of OR gate E, which will initiate bleeping and counting as hereinbefore described.

Figure 12:
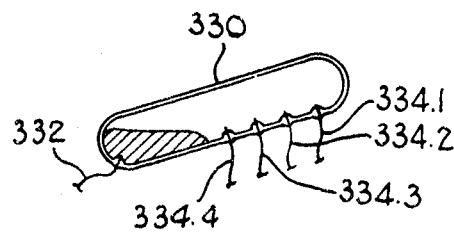
FIG. 12 shows an alternative angle sensitive switch for use with the monitoring device of FIG. 5.

The two angle sensitive mercury switches 286.1 and 286.2 may be replaced by a single angle sensitive mercury switch 330 having a plurality of terminals, as indicated in FIG. 12. The mercury switch 330 may be mounted on a disc 280 as shown in FIG. 10, to permit adjustment thereof.

The mercury switch 330 has a common terminal 332 at one end thereof, and four further terminals indicated by reference numerals 334.1 through to 334.4 respectively, spaced along the length thereof. The mercury switch 330 is adjusted in such a manner that, when the vehicle travels along a level road, then the mercury in the switch will cause electrical contact to be established between the common terminal 332 and all the further terminals 334.1 through to 334.4. If the vehicle travels at an increasingly steep gradient, electrical contact will be broken first with the terminal 334.1, thereafter with the terminal 334.2 and so on until contact with the terminal 334.4 has also been broken. The mercury switch 330 is thus adapted to operate in conjunction with four switches on the accelerator mechanism, instead of only two as hereinbefore described, thereby to provide for four different permitted throttle openings for four different grades of incline. If the switch 330 is to be used in the circuit illustrated in FIG. 11, then the common terminal 332 will be connected to the positive rail +B, one of the terminals, say terminal 334.1, connected to one of the inputs of the AND gate A, and another of the terminals, say terminal 334.2, connected to one of the inputs of the AND gate B. The terminals 334.3 and 334.4 will then be left unconnected.

Figure 13:
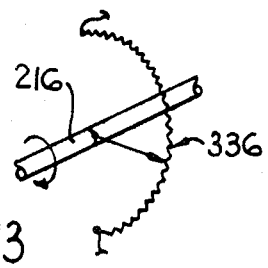
FIG. 13 shows a diagrammatic perspective view of a rheostat connected to the throttle spindle of a motor vehicle for use with an alternative form of monitoring device in accordance with the present invention.
Figure 14:
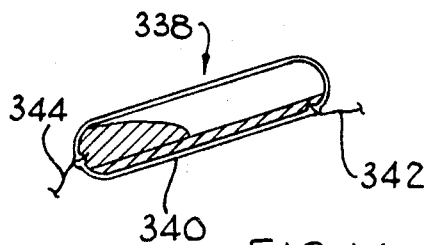
FIG. 14 shows an angle sensitive device for use in conjunction with the rheostat of FIG. 13.
Figure 15:
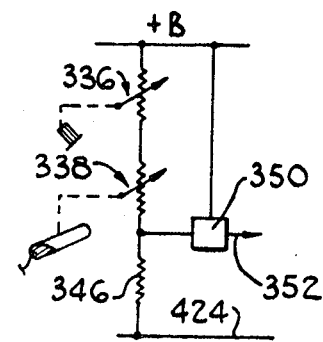
FIG. 15 is a circuit diagram showing the interconnection of the rheostat of FIG. 13 and the angle sensitive device of FIG. 14.

Referring now to FIGS. 13 to 15, there is indicated an arrangement whereby the predetermined degree of throttle opening at which the device will start bleeping is increased gradually as the incline against which the vehicle is to travel increases. In this arrangement, instead of the sheathed cable 208 and the switch box 204, there is mounted a rheostat 336 on the spindle 216. The arrangement is such that the resistance of the rheostat decreases as the accelerator pedal 214 is depressed. Furthermore, instead of the angle sensitive mercury switches 286.1 and 286.2, there is provided a special type of mercury device which is indicated by reference numeral 338 in FIG. 14. The device has a base 340 of resistive material which is connected to one of its terminals 342. The other terminal of the device 338 is indicated by reference numeral 344. The device 338 may also be mounted on a toothed disc 280 as is shown in FIG. 10, to permit adjustment thereof. The operation of the device 338 is such that the resistance between the terminals 342 and 344 varies as the angle of the device 338 is varied. The device 338 is mounted in such a manner in the vehicle that the resistance between the terminals 344 and 342 increases as the incline against which the vehicle is to travel increases.

As will be seen in FIG. 15, the rheostat 336 and the mercury device 338 are connected in series with a further resistor 346 between the positive rail +B and the earth rail 424. The junction between the mercury device 338 and the resistor 346 is connected to the input of a Schmitt trigger 350. The arrangement is such that if the combined resistances of the rheostat 336 and the mercury device 338 drops below a certain predetermined value, then the Schmitt trigger 350 will be triggered, providing a positive pulse on its output terminal 352. This positive pulse may then be utilised to trigger the timer 402 and the pulse generator 404 in FIG. 11. Thus, if the vehicle is travelling along a level road, then the resistance of the mercury device 338 will be low and the Schmitt trigger 350 will be triggered at a relatively small degree of throttle opening. On the other hand, if the vehicle is travelling against a steep incline, then the resistance of the mercury device 338 will be high, permitting deeper depression of the accelerator pedal 214.

Instead of the mercury device 338 on oil dampened pendulum may be used, the pendulum being connected to a rheostat to provide a resistance which depends on the angle of deflection of the pendulum. Alternatively a weight may be provided at the end of a downwardly depending cantilever, and a strain guage mounted in the centilever to provide a resistance depending on the strain in the cantilever, the strain being in turn dependent upon the angle of inclination of the cantilever from the vertical.

If it is desired to monitor also centrifugal acceleration on the vehicle two further mercury switches arranged on discs 280 as illustrated in FIG. 10 may be provided. These discs will then be arranged in use to be rotatable about a horizontal longitudinal axis (ie at right angles to the discs illustrated in FIG. 10). These further mercury switches will be arranged such that their contacts are made upon excessive cornering of the vehicle, one for left hand turns and the other for right hand turns. Their contacts will be connected in parallel with the contacts of the mercury switches 294 and 296.

Referring now to FIG. 16, there is shown an agricultural tractor 366 which has a subsoiler 368 connected to it. On the connection between the tractor 366 and the subsoiler 368 there is mounted a strain guage 370. The strain gauge is operative to increase its resistance as the strain in the connection between the tractor 366 and the subsoiler 368 increases. The strain gauge 370 may be connected in the circuit of FIG. 15 in place of the mercury device 338. Instead of being sensitive to the incline against which the tractor is to travel, the strain gauge 370 will make the device sensitive to the load on the tractor. Accordingly, the greater the load which is presented by the subsoiler 368 on the tractor 366, the further down can the accelerator pedal of the tractor be depressed. Accordingly, instead of the predetermined degree beyond which throttle openings will be monitored being dependent on the incline against which the tractor is travelling, it will be dependent on the load which is presented on the tractor 366.

If desired, any one of the switches 252.1 and 252.2 may have connected in parallel thereto a switch which is adapted, in response to a suitable sensing device, to close in the event of any one of the following conditions:

(1) the vehicle having a flat tire;
(2) the vehicle engine overheating;
(3) low or high vehicle oil pressure;
(4) low level of the vehicle's fuel;
(5) overheat on any of the vehicle's bearings such as wheel bearings, engine bearings, or gearbox bearings;
(6) excessive temperature of the vehicle's brake linings;
(7) excessive temperature of the vehicle's gearbox;
(8) excessive temperature of the vehicle's clutch;
(9) excessive speed of the vehicle;
(10) excessive speed (revolutions per minute) of the vehicle's engine;
(11) excessive pressure in the vehicle's hydraulic brake circuit.

Thus, the existence of any such condition will cause bleeping and counting as if the accelerator pedal has been depressed too far.

A further possibility which is envisaged is that a switch, which may for example be a microswitch or a magnetically operated proximity switch, be provided on the clutch mechanism of the vehicle, the arrangement being such that, when the vehicle's clutch pedal is fully let out or fully depressed then the switch will be open, whereas, when the clutch pedal is in an intermediate position then the switch will be closed. This switch may then also be connected in parallel with the microswitch 252.1 or 252.2. The connection may be via a timer which may have a time delay of say 3 seconds when one of the vehicle's forward gears has been selected, and say 5 seconds when the vehicle's reverse gear has been selected. Such a switch will then be operative to cause bleeping and counting if the clutch pedal is kept for too long in an intermediate position, which may cause damage to the clutch.

It will be appreciated that the angle sensitive means 278.1, 278.2, instead of comprising a mercury switch, may be in any other suitable form. It may, for example, be in the form of a pendulum having photoelectric sensing means for sensing the angular displacement of the pendulum relative to the vehicle.

Referring now to FIG. 17, reference numeral 500 generally indicates a linear cam assembly provided with three microswitches 502.1, 502.2, and 502.3, and which can be used in place of the rotary cam assembly illustrated in FIGS. 5 to 9.

The cam assembly 500 comprises an elongate tube 504 having an elongate slot 506 in the side thereof, a plug 508 at one end thereof, and a plug 510 at the other end thereof. The tube 504 can be clamped in position in a lockable housing (not shown) by means of a pair of clamps 512. Within the tube 504 there is arranged an axially slidable rod 514, one end of which protrudes through an opening in the plug 510. The other or interior end of the rod 514 is attached to the plug 508 by means of a coil spring 516.

On the outside of the tube 504 there is arranged an axially slidable cam sleeve 518 having its end edges bevelled as indicated by reference numerals 520.1 and 520.2 respectively. The cam sleeve 518 is attached to the rod 514 by means of a connection 522 which extends through the slot 506.

In use, the rod 514 will be attached to the throttle linkages of a vehicle so that it will be displaced to the right hand side of the drawing as the accelerator pedal is depressed. The position of the switch 502.1 will be adjusted so that, when the cam sleeve 518 is in its leftmost position, then the bevelled edge 520.1 will only just actuate the switch. With the accelerator pedal of the vehicle in its idling position, the cam sleeve will be displaced slightly to the right hand side of the leftmost position, with the spring 516 under tension and the switch 502.1 unactuated.

It will be seen from the drawing that when the accelerator pedal is depressed beyond a first predetermined position, then the switch 502.2 will be actuated, and when the accelerator pedal is depressed beyond a second predetermined position, then the switch 502.3 will be actuated.

The switches 502.1 and 502.2 will be connected in parallel and may be connected in the circuit of FIG. 11 in place of the switch 252.1. Similarly, the switch 502.3 may be connected in the circuit of FIG. 11 in place of the switch 252.2.

Instead of having a single counter 412 and a single audible alarm 414, there may be provided, in a more sophisticated version of the device, five separate recorders and audible alarms, as indicated in FIG. 18. In FIG. 18 reference numeral 530 generally indicates such a sophisticated version of the monitoring device. It comprises first sensing means 532.1 to sense throttle openings of the vehicle, first signalling means 534.1 to provide an audible signal upon excessive throttle openings being sensed, and recording means 536.1 for recording the incidence of excessive throttle openings. The arrangement of the sensing means 532.1, the signalling means 534.1, and the recording means 536.1 may generally be as indicated in FIG. 11 but with the omission of the mercury switches 294 and 296 and associated circuitry.

Furthermore the device of FIG. 18 comprises second, third, fourth, and fifth sensing means indicated respectively by reference numerals 532.2, 532.3, 532.4, and 532.5 and being operative respectively to sense positive accelerative, negative acceleration (deceleration), centrifugal acceleration on left hand turns, and centrifugal acceleration on right hand turns. The second to fifth sensing means may be inclined mercury switches, two of which are arranged like the mercury tubes 294 and 296 (FIGS. 10 and 11) in a longitudinal vertical plane and the other two of which are also arranged like the mercury switches 294 and 296 but in a transverse vertical plane.

With each sensing means 532.2 through to 532.5 there is associated signalling means respectively indicated by reference numerals 534.2, 534.3, 534.4, and 534.5, and recording means respectively indicated by reference numerals 536.2, 536.3, 536.4, and 536.5.

The sophisticated version 530 is thus able to discriminate between the various types of driving errors and can be used for driver instruction or driver improvement. Such a sophisticated apparatus could, of course, also be used for monitoring the operation of vehicles generally for record purposes for fleet owners. However, once drivers have become used to having their driving monitored, then their vehicles may be fitted with less sophisticated (and less expensive) versions of the invention, without loss of effectiveness in control.

A less sophisticated version may, for example, have first signalling means and first recording means associated with the sensing means 532.1, and second signalling means and second recording means associated with all the sensing means 532.2 through to 532.5.

If the second through to the fifth sensing means are set to sense relatively small accelerative, decelerative, or centrifugal forces then they will also be relatively sensitive to inclination of the vehicle in the corresponding direction. Thus, if the sensing means 532.2 for sensing accelerative forces is in the form of a mercury switch and it is set at a small angle so that small rates of increase in speed can be sensed, then the mercury switch will also be actuated when the vehicle climbs a slope having a relatively small incline. This would cause counts to be recorded by the recording means 536.1 which would give an unfair indication of the driver's driving performance.

To overcome the above problem there may be provided an arrangement illustrated in block-diagram form in FIG. 20 and which is described with reference to FIG. 19.

Referring now to FIG. 19 of the drawings, there is shown at 600.1 a vehicle travelling along a level road. The weight of the vehicle is indicated by vector W, the reaction force of the road on the vehicle by vector R, and the accelerative force applied by the vehicle's engine in the direction of travel by vector F. The accelerative force F is over and above the driving force required to keep the vehicle moving at a steady forward speed. Alternatively, if the vehicle's brakes were applied, then a decelerative force D (shown dotted) will be applied to the vehicle.

Reference numeral 600.2 indicates the vehicle when it is travelling up an incline. In this case an accelerative force F over and above the driving force required to keep the vehicle moving at a steady speed along a level road will have to be applied by the vehicle's engine in order to keep the vehicle moving up the incline at a steady speed.

Reference numeral 600.3 indicates the vehicle when it is travelling down an incline. In this case a decelerative force D will have to be applied to the vehicle by its brakes in order to keep the vehicle moving down the incline at a steady speed.

Referring now to FIG. 20, there is shown part of a monitoring device 602 for monitoring the operation of the vehicle. The remaining part of the monitoring device will generally be the same as that shown in FIG. 11 with the omission of the mercury switches 294 and 296 and associated circuitry. The monitoring device 602 includes an inertial device comprising two glass capsules 604.1 and 604.2 each containing a quantity of mercury 606 and having a pair of electrodes 608. The capsules 604.1 and 604.2 are installed in the vehicle at an angle in a longitudinally extending vertical plane. The capsule 604.1 is adapted to sense accelerative forces with the vehicle moving in direction 610, whereas the capsule 604.2 is adapted to sense decelerative forces with the vehicle moving in that direction.

The monitoring device 602 further comprises a pulse generator 612 which is adapted to generate pulses at a frequency of about one pulse per second. There is further provided a loudspeaker 614, an additive memory 616, a comparator 618, a timer 620, and a counter 622.

The operation of the monitoring device is as follows. When an accelerative force F of sufficient magnitude is applied to the vehicle (whether to increase its speed while it is moving along a level road, or to maintain its speed while it is travelling up an incline), the mercury 606 in the capsule 604.1 will move towards the upper end of the capsule, establishing contact between the electrodes 608. This sets into operation the pulse generator 612 and starts the timer 620. The pulse generator 612 then issues a series of pulses at a frequency of one pulse per second for as long as there is electrical contact between the electrodes 608 of the capsule 604.1. Each pulse of the pulse generator 612 causes a bleep to be issued by the loudspeaker 614. Also, the number of bleeps occurring are counted and the sum memorised by the additive memory 616.

The timer 620 has a time constant of about ten seconds (this may be adjustable). At the end of the time constant of the timer 620, the number of bleeps which have occurred during the time constant are compared with the number 10 (in the case of a pulse frequency of 1 pulse per second and a time constant of 10 seconds). It there have been less than 10 bleeps, then the actual number of bleeps that have occurred, as recorded by the memory 616, are fed to the counter 622 and added to the existing count of the counter. However, if a full complement of 10 bleeps have occurred during the time constant, then no further counts will be added by the counter 622 and further operation of the pulse generator 612 will be inhibited until such time as electrical contact between the two electrodes 608 of the capsule 604.1 is again broken. Accordingly, the bleeping will stop after 10 seconds.

When electrical contact between the electrodes 608 of the capsule 604.1 is broken again, the timer 620 and the additive memory 616 will be reset and the device will be ready for the next operational cycle of ten seconds as soon as electrical contact between the electrodes 608 is again established.

The operation of the capsule 604.2 is similar to that of the capsule 604.1 except that it is sensitive to decelerative forces on the vehicle instead of accelerative forces. Accordingly, electrical contact between the electrodes 608 of the capsule 604.2 will be established if the driver of the vehicle brakes excessively or where the vehicle moves downhill as indicated at 600.3 in FIG. 19.

Where the vehicle travels along a level road as indicated at 600.1 in FIG. 19, abusive acceleration or deceleration will be recorded by the monitoring device 602. This is so because it will never be possible for the driver of the vehicle to sustain such acceleration or deceleration for longer than ten seconds. On the other hand, where the vehicle moves up or down an incline as indicated by reference numerals 600.2 and 600.3 in FIG. 19, then the accelerative or decelerative force on the vehicle required to overcome the gravitational force on the vehicle will almost always be sustained for longer than ten seconds so that no counts will be recorded against the driver under such circumstances. Also, where the vehicle is of the type having a tippable cab and monitoring device is mounted in the cab, no counts will be recorded when the cab is tipped for maintenance or repair work on the vehicle.

In order to prevent the device from recording counts where the vehicle is gradually coming to the end of an incline or decline, or where the cab is tipped back to its normal position after a repair job, and where, due for example to vibration, contact between the electrodes 608 is intermittently broken during a transition period, the device 602 may be provided with a further time (not shown). Such further timer will then be operative to delay resetting of the timer 620 and the additive memory 616 for a few seconds so as to allow contact between the electrodes 608 to be broken positively.

The monitoring device 602 may, if desired, comprise two additional glass capsules (not shown) similar to the glass capsules 604.1 and 604.2 but arranged at an angle in a transversely extending vertical plane. Their connection to and co-operation with the rest of the circuitry shown in FIG. 20 will be the same as described in respect of the capsules 604.1 and 604.2. The function of the additional glass capsules will be to sense transverse forces on the vehicle due to the vehicle cornering or being parked on or driven along a banked road.

Figure 21:
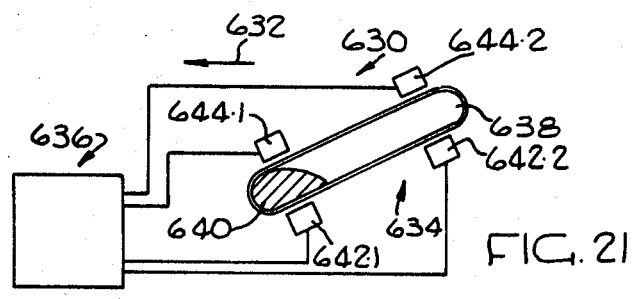
FIG. 21 shows a device in accordance with the present invention for detecting acceleration or angle of inclination of a motor vehicle.
Figure 22:
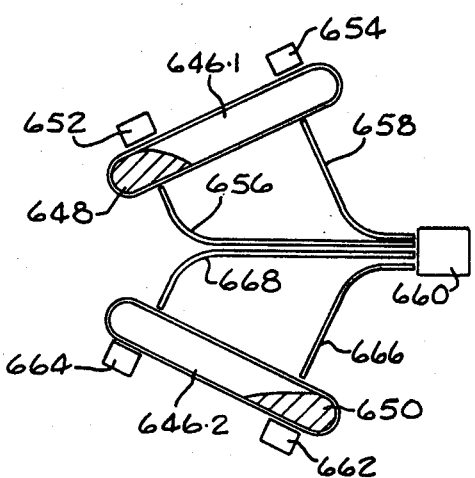
FIG. 22 shows part of a device in accordance with the present invention for detecting acceleration and deceleration, or angle of inclination in either one of two directions of a motor vehicle.
Figure 23:
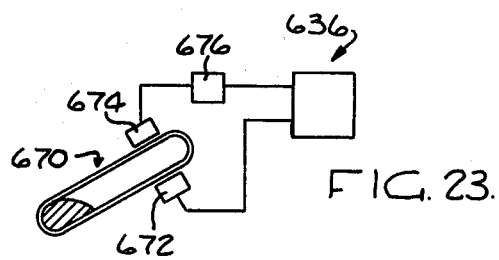
FIG. 23 shows a simpler version of the device illustrated in FIG. 21.

Instead of being provided with electrodes, the mercury switches 148 (FIG. 4), 286.2, 294, and 296 (FIGS. 10 and 11) may be provided with light emitting diodes and photo-electric cells as illustrated in FIGS. 21 to 23.

Referring now to FIG. 21, reference numeral 630 generally indicates a sensing device for detecting acceleration of a vehicle in its forward direction 632, or uphill inclination of the vehicle. The sensing device 630 comprises an assembly 634 and a switching device 636.

The assembly 634 comprises a glass capsule 638 which is installed in the vehicle and of which the angle is a longitudinally extending vertical plane is adjustable. Within the capsule there is a quantity of mercury 640.

At the lower end of the capsule 638 there are mounted externally on opposite sides of the capsule respectively a light source in the form of a light emitting diode 642.1 and a light receptor in the form of a photoelectric cell 644.1. Similarly, at the other or upper end of the capsule 638 there are mounted on opposite sides of the capsule respectively, a light emitting diode 642.2 and a photoelectric cell 644.2. The light emitting diodes 642.1 and 642.2, and the photoelectric cells 644.1 and 644.2 are connected to the switching device 636.

In use, when the vehicle accelerates in direction 632 or travels up an incline, then the quantity of mercury 640 will tend to move to the upper end of the capsule 638. If the degree of acceleration or incline is sufficiently high, then the body of liquid 640 will move away from between the light emitting diode 642.1 and the photoelectric cell 644.1, permitting light from the light emitting diode 642.1 to reach the photoelectric cell 644.1, and will move to a position in which it obstructs the passage of light from the light emitting diode 642.2 to the photoelectric cell 644.2. The switching device 636 is arranged to be switched to one of its states when no light from the light emitting diode 642.1 reaches the photoelectric cell 644.1 and when light from the light emitting diode 642.2 reaches the photoelectric cell 644.2, and to be switched to its other state when light from the light emitting diode 642.1 does reach the photoelectric cell 644.1 and no light from the light emitting diode 642.2 reaches the photoelectric cell 644.2. In this mode of operation the light emitting diodes 642.1 and 642.2 will continuously be energised.

Alternatively, in order to conserve power, the arrangement may be such that the light emitting diode 642.2 is only energised when light from the light emitting diode 642.1 reaches the photoelectric cell 644.1, and then, only when the path between the light emitting diode 642.2 and the photoelectric cell 644.2 is obstructed, that the switching device 636 switches from its one state to its other state.

Referring now to FIG. 22, there are shown two glass capsules 646.1 and 646.2. Like with the capsule 638 shown in FIG. 21, capsules 646.1 and 646.2 are also adjustable in a longitudinally extending vertical plane. The capsule 646.1 contains a body of mercury 648 and the capsule 646.2 contains a body of mercury 650.

The capsule 646.1 has a pair of photoelectric cells 652 and 654 arranged in a similar fashion as the photoelectric cells 644.1 and 644.2 in FIG. 21. The light emitting diodes 642.1 and 642.2 of FIG. 21 are, however, replaced in FIG. 22 by two optical fibres 656 and 658 respectively. The optical fibres 656 and 658 lead to a common light source in the form of a light emitting diode 660. Similarly, the capsule 646.2 has photoelectric cells 662 and 664, and a pair of optical fibres 666 and 668. The optical fibres 666 and 668 also lead to the light emitting diode 660.

The photoelectric cells 652, 654, 664 and 662 will also be connected to a switching device (not shown) similar to that shown at 636 in FIG. 21. The operation of the device shown in FIG. 22 will be similar to the first mode of operation described with reference to FIG. 21, except that the device of FIG. 22 will be able to sense both acceleration and deceleration, or both upward and downward inclination of the vehicle, beyond a predetermined degree.

In addition to the tubes 646.1 and 646.2, two further tubes (not shown) may be provided arranged at an angle in a transverse vertical plane. These will have light detectors similar to those shown for the tubes 646.1 and 646.2, an optical fibre or a separate light source being associated with each of the light detectors. These additional tubes will then be operative to sense excessive cornering of the vehicle.

In FIG. 23 there is shown a capsule 670 which is set up like the tube 638 illustrated in FIG. 21. If desired, there may be four of such tubes, two arranged in a longitudinal vertical plane and two in a transverse vertical plane, as described with reference to FIG. 22.

The tube 670 is provided with a single light emitting diode 672 (or an optical fibre as shown in FIG. 22) and a single photo-electric cell 674. The photo-elelctric cell 674 is connected to the switching circuit 636 (similar to that shown in FIG. 21) via a time delay circuit 676 having a time delay of about 0.13 to 0.15 seconds. The time delay circuit 676 will operate to prevent switching of the circuit 636 under transient conditions, e.g. when splashing mercury should temporarily interrupt the path between the light emitting diode 672 and the photo-electric cell 674.

Instead of having a counter such as that shown, for example, at 412 in FIG. 11, a chart recorder may be provided on which excesses may be recorded as spikes in a graph. Other parameters such as vehicle travelling time, road speed or the like, may then also be recorded on the chart of the recorder.

Instead of the arrangement shown in FIG. 20, there may be provided two mercury devices as hereinbefore described arranged in a longitudinal vertical plane and inclined in the same direction, a first one of which being inclined at a similar angle than the second. The first switching device will be arranged to open when the vehicle travels up a moderate incline and the second switching device will be arranged to close under heavy acceleration. In such arrangement the first switching device will be connected in series with an accelerator switch as that indicated by reference numeral 252.1 in FIG. 11 so as to energise a bleeping device and a counting device when both the first switching device and the accelerator switch are closed. The second switching device, when operative, is arranged to cause bleeping and counting to take place when the accelerator switch 252.1 is closed, and it itself is also closed, that is, under heavy acceleration, even if the first switching device is open. However, a timing device will be provided associated with the first switching device which will put the second switching device out of operation after a time delay of, say, 6 seconds after the first switching device has opened.

Accordingly, should the driver accelerate at a rate which is sufficient to cause opening of the first switching device, but not sufficient to cause closure to the second switching device, then no bleeping or counting will take place. If, on the other hand acceleration is sufficiently high so that the first switching device opens and within the time delay of 6 seconds the second switching device closes, then bleeping and counting will occur. However, when the vehicle approaches a steep incline which is sufficiently steep to cause the first switching device to open and also the second switching device to close, then, in most cases, the second switching device will only close more than 6 seconds after opening of the first switching device. Thus, by the time the second switching device closes, it will no longer be operative and no bleeping and counting will take place when the accelerator switch is closed.

What I claim is:

1. A method of monitoring the operation of a motor vehicle, which method comprises the steps of:
   sensing the vehicle's throttle opening;
   sensing a parameter which corresponds to the magnitude of a variable load force acting on the vehicle in a direction opposite the direction of forward travel of the vehicle; and
   giving an indication when the throttle opening exceeds a predetermined throttle opening value, the predetermined throttle opening value being a stepwise increasing function of said parameter, said function increasing in two or more steps as said parameter increases.

2. A method as claimed in claim 1, wherein said parameter is the angle of inclination of the vehicle to the horizontal in the direction of forward travel of the vehicle, said load force being gravitational.

3. A method as claimed in claim 1, said load force being imposed by a load drawn by the vehicle via a draught connection, wherein said parameter is the load in the draught connection.

4. A method as claimed in claim 1, wherein giving said indication comprises issuing a warning signal to the driver of the vehicle.

5. A method as claimed in claim 1, wherein giving said indication includes making a recording.

6. A method as claimed in claim 1, wherein giving said indication comprises issuing a warning signal to the driver and then a predetermined time thereafter, if the throttle opening has not by then been reduced to below said predetermined value, making a recording.

7. A method as claimed in claim 5, wherein making of said recording comprises recording unit counts at spaced intervals of time while the throttle opening exceeds said predetermined value.

8. A method as claimed in claim 1, which further comprises sensing accelerative, decelerative or centrifugal force on the vehicle in a plane parallel to the surface on which the vehicle is supported, and giving an indication when said force exceeds a predetermined value irrespective of the throttle opening.

9. A method as claimed in claim 8, wherein said accelerative, decelerative or centrifugal force is sensed over a predetermined length of time, and which includes making a recording if such accelerative, decelerative or centrifugal force has exceeded the predetermined value for less than the predetermined length of time, whilst inhibiting making of said recording if such force has exceeded the predetermined value for the whole of the predetermined length of time.

10. A method as claimed in claim 9, wherein said predetermined length of time is between about 2 and 15 seconds.

11. Apparatus for monitoring the operation of a motor vehicle subjected to a load force acting on the vehicle in a direction opposite the direction of forward travel of the vehicle, which apparatus comprises:
   first sensing means for sensing the vehicle's throttle opening, said first sensing means including first throttle sensitive means for sensing whether the throttle opening is above or below a first predetermined degree, and second throttle sensitive means for sensing whether the throttle opening is above or below a second, greater predetermined degree;
   second sensing means for sensing a parameter which corresponds to the magnitude of said load force, said second sensing means including first parameter sensitive means for sensing whether said parameter is above or below a first predetermined value and second parameter sensitive means for sensing whether said parameter is above or below a second higher predetermined value; and
   indicating means operative in response to said first sensing means and said second sensing means to give an indication either when the parameter is above said first predetermined value and the throttle opening is above said first predetermined degree, or when the parameter is above said second predetermined value and the throttle opening is above said second predetermined degree.

12. Apparatus as claimed in claim 11, wherein the second sensing means is angle sensitive means adapted to sense the angle of inclination of the vehicle to the horizontal in the direction of travel of the vehicle, said load force being gravitational.

13. Apparatus for monitoring the operation of a motor vehicle subjected to a load force acting on the vehicle in a direction opposite the direction of forward travel of the vehicle, which apparatus comprises:
   first sensing means for sensing the vehicle's throttle opening;
   second sensing means for sensing a parameter which corresponds to the magnitude of said load force; and
   indicating means operative in response to the first sensing means and the second sensing means to give an indication when the throttle opening exceeds a predetermined throttle opening value, which predetermined throttle opening value is, over at least part of the range of said parameter, a continuously increasing function of said parameter.

14. Apparatus as claimed in claim 11, which further comprises an inertial device for sensing accelerative, decelerative, or centrifugal force on the vehicle in a plane parallel to the surface on which the vehicle is supported, and indicating means operable in response to the inertial device to give an indication when such force exceeds a predetermined value irrespective of throttle opening.

15. Apparatus as claimed in claim 14 which further comprises comparator means operative in response to the inertial device to determine whether said accelerative, decelerative or centrifugal force has exceeded the predetermined value for less than or for the whole of a predetermined length of time, the indicating means being operable in response to the comparator means to provide a recording when said force has exceeded the predetermined value for less than the predetermined length of time, whilst inhibiting recording when said force has exceeded said predetermined value for the whole of the predetermined length of time.

16. Apparatus as claimed in clim 14, wherein said inertial device comprises a container; a body of liquid contained in the container; a radiation emitter; and a radiation receptor for receiving radiation from the emitter; the body of liquid being displaceable in the container under inertial force and the emitter and receptor being arranged to detect the position of the body of liquid in the container thereby giving an indication of the existence of said accelerative, decelerative or centrifugal force.

17. Apparatus as claimed in claim 15, wherein said inertial device comprises a container; a body of liquid contained in the container; a radiation emitter; and a radiation receptor for receiving radiation from the emitter; the body of liquid being displaceable in the container under inertial force and the emitter and receptor being arranged to detect the position of the body of liquid in the container thereby giving an indication of the existence of said accelerative, decelerative or centrifugal force.

18. Apparatus as claimed in claim 12, wherein the first sensing means comprises a container; a body of liquid contained in the container; a radiation emitter; and a radiation receptor for receiving radiation from the emitter; the body of liquid being displaceable in the container upon inclination of the container, and the emitter and the receptor being arranged to detect the position of the body of liquid in the container thereby giving an indication of the angle of inclination of the container.

19. Apparatus as claimed in claim 18, wherein the emitter is a light emitter and the receptor a light detector, the emitter and detector being arranged on opposite sides of the container, the container permitting passage therethrough of light from the emitter to the detector, and the liquid being opaque to light.

20. A method of monitoring the operation of a motor vehicle, which method comprises the steps of:
   sensing the vehicle's throttle opening;
   sensing a parameter which corresponds to the magnitude of a variable load force acting on the vehicle in a direction opposite the direction of forward travel of the vehicle; and
   giving an indication when the throttle opening exceeds a predetermined throttle opening value, the predetermined throttle opening value being, over at least part of the range of said parameter, a continuously increasing function of said parameter.

* * * * *